United States Patent
Roh

(10) Patent No.: US 9,904,478 B2
(45) Date of Patent: Feb. 27, 2018

(54) STORAGE DEVICE AND METHOD FOR CONTROLLING THEREOF

(71) Applicant: Samsung Electronics Co., Ltd., Suwon-si, Gyeonggi-do (KR)

(72) Inventor: Kangho Roh, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/217,957

(22) Filed: Jul. 22, 2016

(65) Prior Publication Data

US 2017/0060443 A1    Mar. 2, 2017

(30) Foreign Application Priority Data

Aug. 31, 2015    (KR) .................. 10-2015-0122630

(51) Int. Cl.
G11C 16/04    (2006.01)
G06F 3/06    (2006.01)
G11C 16/10    (2006.01)

(52) U.S. Cl.
CPC .......... *G06F 3/0613* (2013.01); *G06F 3/0616* (2013.01); *G06F 3/0634* (2013.01); *G06F 3/0679* (2013.01); *G11C 16/10* (2013.01)

(58) Field of Classification Search
CPC ..... G03F 3/0613; G03F 3/0634; G06F 3/0679
USPC .................................................. 365/185.03
See application file for complete search history.

(56) References Cited

U.S. PATENT DOCUMENTS

| | | | | |
|---|---|---|---|---|
| 7,646,639 | B2* | 1/2010 | Lee | G11C 16/0483 365/185.03 |
| 7,900,102 | B2* | 3/2011 | Sokolov | G06F 11/1072 714/719 |
| 7,916,536 | B2* | 3/2011 | Roohparvar | G11C 16/10 365/185.03 |
| 7,924,648 | B2* | 4/2011 | Sokolov | G06F 1/3203 365/189.011 |
| 7,953,950 | B2 | 5/2011 | Fujimoto | |
| 8,370,662 | B2 | 2/2013 | Kim | |
| 8,645,619 | B2 | 2/2014 | Belluomini et al. | |
| 8,671,260 | B2 | 3/2014 | Abe et al. | |
| 8,848,445 | B2* | 9/2014 | Sprouse | G11C 7/1015 365/185.12 |
| 8,850,153 | B2 | 9/2014 | Tressler et al. | |
| 8,935,463 | B1 | 1/2015 | Aswadhati et al. | |
| 9,514,823 | B2* | 12/2016 | Melik-Martirosian | G11C 16/10 |

(Continued)

FOREIGN PATENT DOCUMENTS

JP    5113433 B2    10/2012
KR    101480424 B1    1/2015

*Primary Examiner* — Pho M Luu
*Assistant Examiner* — Xiaochun L Chen
(74) *Attorney, Agent, or Firm* — Renaissance IP Law Group LLP

(57) ABSTRACT

Provided are a storage device and a method for controlling thereof. Some embodiments include a method, comprising: receiving target performance information by a storage device; comparing the target performance information with maximum performance information by the storage device; and adjusting an incremental step pulse program (ISPP) operation performed on a memory cell of the storage device in response to the comparing of the target performance information with maximum performance information.

19 Claims, 9 Drawing Sheets

(56) References Cited

U.S. PATENT DOCUMENTS

| | | | |
|---|---|---|---|
| 2005/0024941 A1* | 2/2005 | Lasser | G11C 11/5628 365/185.19 |
| 2008/0084749 A1* | 4/2008 | Lee | G11C 16/12 365/185.18 |
| 2008/0126686 A1* | 5/2008 | Sokolov | G06F 1/3203 711/103 |
| 2008/0148115 A1* | 6/2008 | Sokolov | G06F 11/1072 714/719 |
| 2009/0027970 A1* | 1/2009 | Roohparvar | G11C 16/10 365/185.18 |
| 2011/0231686 A1 | 9/2011 | Fujii et al. | |
| 2012/0320679 A1* | 12/2012 | Sprouse | G11C 7/1015 365/185.12 |
| 2013/0211809 A1 | 8/2013 | Maruyama | |
| 2015/0032915 A1 | 1/2015 | Hur et al. | |
| 2015/0310921 A1* | 10/2015 | Melik-Martirosian | G11C 16/10 365/185.19 |

\* cited by examiner

| OPERATING MODE | PERFORMANCE | $T_{PROG}$ |
|---|---|---|
| MODE 1 | HIGH | $T_1$ |
| MODE 2 | MEDIUM | $T_2$ |
| MODE 3 | LOW | $T_3$ |

2

| OPERATING MODE | PERFORMANCE | CELL MODE |
|---|---|---|
| MODE 1 | HIGH | SLC MODE |
| MODE 2 | MEDIUM | MLC MODE |
| MODE 3 | LOW | TLC MODE |

STORAGE DEVICE AND METHOD FOR CONTROLLING THEREOF

This application claims priority from Korean Patent Application No. 10-2015-0122630 filed on Aug. 31, 2015 in the Korean Intellectual Property Office, the disclosure of which is incorporated herein by reference in its entirety.

BACKGROUND

1. Field of the Inventive Concept

Embodiments relate to a storage device and a method for controlling thereof.

2. Description of the Related Art

Performance of a storage device, for example, a solid state drive (SSD) is being continuously improved. The storage capacity of SSDs is increasing, and a bandwidth at which the SSD writes or reads data is also increasing. However, an external device which stores or reads the data on and from the SSD, e.g., a host device, may include a device that does not support the maximum bandwidth of the SSD, and in some cases, not all of the bandwidth of the SSD is used.

SUMMARY

Some embodiments include a method, comprising: receiving target performance information by a storage device; comparing the target performance information with maximum performance information by the storage device; and adjusting an incremental step pulse program (ISPP) operation performed on a memory cell of the storage device in response to the comparing of the target performance information with maximum performance information.

Some embodiments include a method, comprising: receiving target performance information by a storage device; comparing, by the storage device, a target bandwidth of the target performance information with a maximum bandwidth of maximum performance information; and changing a programming mode of a memory cell of the storage device based on a comparing of the target bandwidth and the maximum bandwidth.

Some embodiments include a method, comprising: receiving target performance information by a storage device; comparing the target performance information with maximum performance information by the storage device; and adjusting an incremental step pulse program (ISPP) operation performed on a memory cell of the storage device to increase service life of the storage device if the comparing of the target performance information with maximum performance information indicates that a performance capability of the storage device is greater than a performance capability associated with the target performance information.

BRIEF DESCRIPTION OF THE DRAWINGS

The above and other aspects and features will become more apparent by describing in detail particular embodiments thereof with reference to the attached drawings, in which.

DETAILED DESCRIPTION

Figure 1:
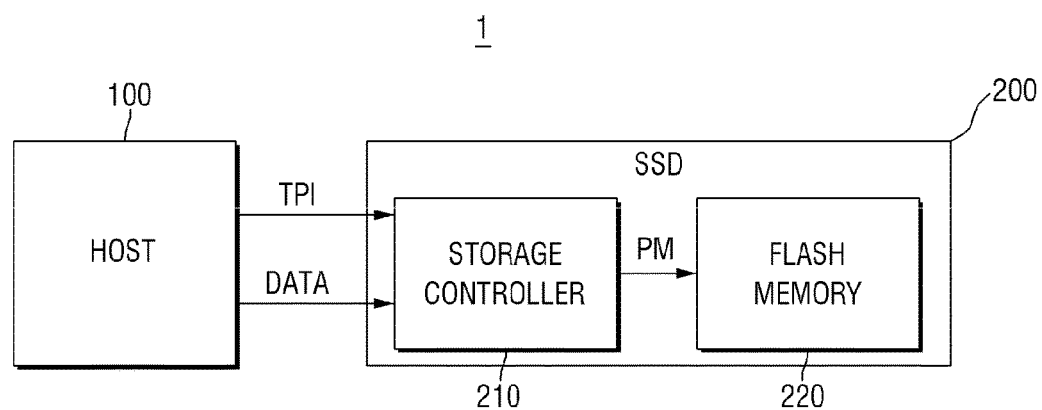
FIG. 1 is a schematic diagram illustrating a storage device according to an embodiment.

Embodiments will be described in detail with reference to the accompanying drawings. Embodiments may, however, take various different forms, and should not be construed as being limited only to the particular embodiments. Rather, these embodiments are provided as examples so that this disclosure will be thorough and complete, and will fully convey the concepts to those skilled in the art. Accordingly, known processes, elements, and techniques may not be described with respect to some of the embodiments. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings herein.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under"

can encompass both an orientation of above and below. The device may be otherwise oriented (rotated 90 degrees or at other orientations) and the spatially relative descriptors used herein interpreted accordingly. In addition, it will also be understood that when a layer or other structure is referred to as being "between" two layers or structures, it can be the only layer or structure between the two layers or structures, or one or more intervening layers or structures may also be present.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art.

It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein. Hereinafter, particular embodiments will be described with reference to the attached drawings.

FIG. 1 is a schematic diagram illustrating a storage system according to an embodiment. Referring to FIG. 1, a storage system 1 according to an embodiment includes a host device 100 (or an external device) and a storage device 200.

The host device 100 may be configured to transmit the data input/output requests to the storage device 200. The data input/output requests may include data input/output commands, such as write, read and erase of data. The host 100 may be configured to receive the input of the data input/output commands to the storage device 200 from a user, or may receive the input from software running on the host 100. In some embodiments, the host 100 may include, for example, a personal computer including a desktop, a workstation, a server computer, a server cluster, a portable computer including a laptop computer, and a portable device including a cellular phone, a smart phone, a tablet PC, an MP3, a portable multimedia player (PMP), a personal digital assistant (PDA), a digital camera and a video camera.

The storage device 200 includes a storage controller 210 and a flash memory 220. In some embodiments, the storage device 200 may be a solid state drive (SSD). The storage controller 210 may be configured to control general operations of the flash memory 220. The flash memory 220 may be configured to perform data input and output operations, for example, write, read and erase operations, according to the control of the storage controller 210.

In some embodiments, the storage controller 210 may include a processor such as a general purpose processor, a digital signal processor (DSP), an application specific integrated circuit, a microcontroller, a programmable logic device, discrete circuits, a combination of such devices, or the like. The storage controller 210 may include internal portions, such as registers, cache memory, processing cores, or the like, and may also include external interfaces, such as address and data bus interfaces, interrupt interfaces, or the like. Although only storage controller 210 is illustrated in the storage device 200, multiple storage controllers 210 may be present. In addition, other interface devices, such as logic chipsets, hubs, memory controllers, communication interfaces, or the like may be part of the storage device 200 to connect the storage controller 210 to internal and external components In some embodiments, the host device 100 may be configured to provide target performance information (TPI) to the storage controller 210. Here, the target performance information may refer to throughput requested by the host device 100; however, in other embodiments, the TPI may refer to other performance aspects, such as latency, power consumption, or the like. Using throughput as an example, the target throughput value may be expressed by the bandwidth of the storage device 200, e.g., 3 GB/s. As another example, the target throughput value may include a plurality of values, such as 4 GB/s at the time of data read, and 2 GB/s at the time of data write. The storage controller 210 may be configured to adjust the rate of the program PM of the flash memory 220, using the target performance information received from an external device, i.e., the host device 100. This will be described in more detail below in connection with FIG. 2.

The flash memory 220 may be configured to store the data provided from the controller 210 in the memory cell. Specifically, the flash memory 220 may include multiple cell arrays configured to store data. The cell array may include multiple planes PL1 to PLi (where, i is a natural number). The planes PL1 to PLi include multiple blocks BLK11 to BLKnm (where, n and m are natural numbers), and the blocks BLK11 to BLKnm include multiple pages PAGE1 to PAGEk (where, k is a natural number). The blocks BLK11 to BLKnm may be units of granularity for an erase command That is, the erase command may be performed in units of blocks. The pages PAGE1 to PAGEk may be units of granularity for program or read commands That is, program and read operations may be performed in units of pages. In some embodiments, the size of pages and the size of blocks may be different.

In some embodiments, the flash memory 220 may be a non-volatile memory device such as an electrically erasable programmable read-only memory (EEPROM), a ferroelectric random access memory (FRAM), a phase-change random access memory (PRAM), and a magnetic random access memory (MRAM). In some embodiments, the flash memory 220 may, but need not be limited to a NAND flash memory device.

Figure 2:
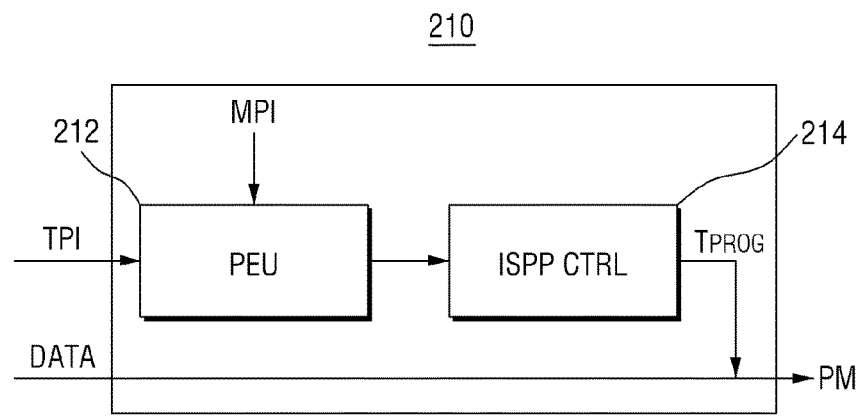
FIG. 2 is a schematic diagram illustrating a storage controller according to an embodiment.

FIG. 2 is a schematic diagram illustrating the storage controller according to an embodiment. Referring to FIG. 2, the storage controller 210 according to an embodiment includes a performance evaluation unit (PEU) 212 and an ISPP control unit (ISPP CTRL) 214. In some embodiments, the performance evaluation unit 212 and/or the ISPP control unit 214 may be implemented in software executing on a processor of the storage controller 210. In other embodiments, the performance evaluation unit 212 and/or the ISPP control unit 214 may be implemented in circuitry of the storage controller 210. In other embodiments, the performance evaluation unit 212 and/or the ISPP control unit 214 may be implemented by a combination of software and circuitry. Regardless of how implemented, the performance evaluation unit 212 and the ISPP control unit 214 may be configured to perform the functions described herein.

The performance evaluation unit 212 may be configured to receive the target performance information (TPI) and the internal maximum performance information (MPI), and compare the target performance information (TPI) with the maximum performance information (MPI). Here, the performance evaluation unit 212 may be configured to receive the target performance information (TPI) from an external device, such as the host device 100, a baseboard management controller, or the like, and the maximum performance information (MPI) may be set in the storage device 200 in advance. In other embodiments, performance evaluation unit 212 may be configured to receive the maximum performance information (MPI) from an external device similar to the target performance information (TPI).

The ISPP control unit 214 may be configured to extend an incremental step pulse program prolong time (ISPP) $T_{PROG}$ of the memory cell of the storage device 200, when the target throughput value required by the target performance information (TPI) is lower than the maximum throughput value of the maximum performance information (MPI). Hereinafter, for convenience of explanation, the throughput value is assumed to mean the value of the bandwidth of the storage device 200, but other embodiments are not limited thereto.

For example, when the target throughput value of the host 100 is 6 GB/s and the maximum throughput value of the storage device 200 is 6 GB/s, the storage controller 210 may be configured to program the memory cells of the flash memory 220, represented by PM, at a maximum rate corresponding to the maximum throughput value so that the ISPP time $T_{PROG}$ of the memory cell of the flash memory 220 becomes a minimum time. Alternately, for example, when the target throughput value of the host 100 is 3 GB/s and the maximum throughput value of the storage device 200 is 6 GB/s, the storage controller 210 may be configured to extend the ISPP time $T_{PROG}$ used to program (PM) the memory cells of the flash memory 220 to reduce the rate at which the memory cells are programmed. A detailed description of examples of extending the ISPP time $T_{PROG}$ will be described below in connection with FIGS. 3 and 4.

In this way, if the target throughput value of the host 100 is lower than the maximum throughput value of the storage device 200, the service life of the storage device 200 can be extended due to the limited use of the bandwidth of the storage device 200. For example, programming of the memory cells at maximum rate reduces the service life of the memory cell, which eventually affects the service life of the storage device 200. In particular, in a data center application that uses a large-scale storage device, the reliability of data may be more important than the data input and output rates. Accordingly, the service life of the storage device may be extended by restrictively using a storage device capable of achieving higher data input and output rates.

Figure 3:
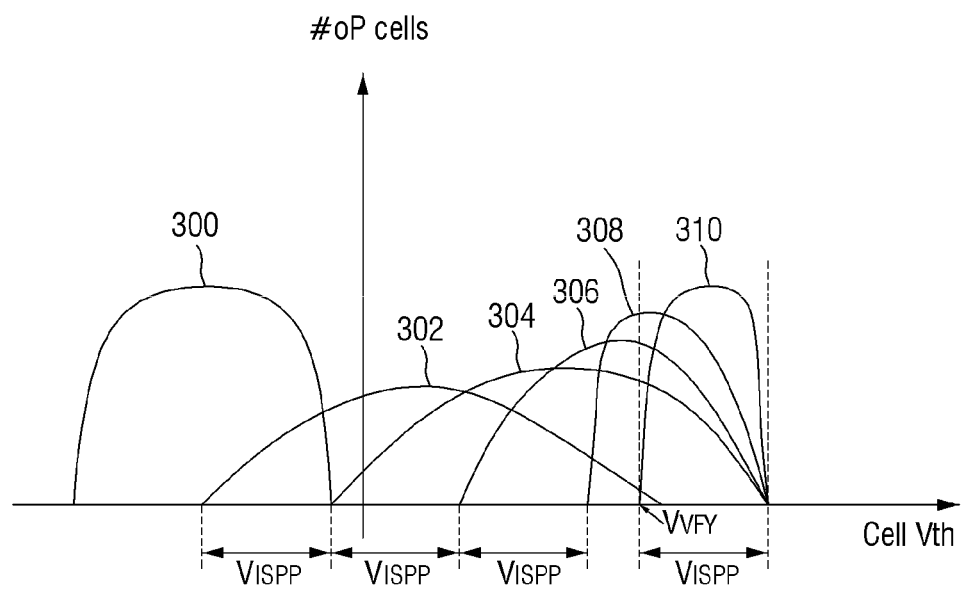
FIG. 3 is a schematic diagram illustrating execution of an incremental step pulse program (ISPP) on a memory cell according to an embodiment.

FIG. 3 is a schematic diagram illustrating the execution of the incremental step pulse program (ISPP) on the memory cell according to an embodiment, and FIG. 4 is a schematic diagram illustrating the ISPP time $T_{PROG}$ according to an embodiment.

Referring to FIG. 3, the ISPP technique for programming the memory cell according to an embodiment uses multiple steps when changing the states of the memory cell. For example, to change the voltage of the cells corresponding to a first state 300 into a second state 310, the process goes through multiple intermediate steps, such as steps 302, 304, 306, and 308. A voltage $V_{ISPP}$ used to increment a program voltage over the respective steps may be maintained relatively constant.

Referring to FIG. 4, the steps in the ISPP technique may include a program step or a verification step. The first program step is performed at time $t_0$, and the first verification step is performed at time $t_1$. Here, the first program step corresponds to a voltage $V_S$, and the first verification step corresponds to the voltage $V_{VFY}$. Next, a second program step is performed at time $t_2$, and a second verification step is performed at time $t_3$. Here, the second program step corresponds to a voltage $V_S+V_{ISPP}$, and the second verification step corresponds to a voltage $V_{VFY}$. By repeating such a process, a fifth program step is performed at time $t_8$, and a fifth verification step is performed at time $t_9$. Here, the fifth program step corresponds to a voltage $V_S+4*V_{ISPP}$, and the fifth verification step corresponds to the voltage $V_{VFY}$.

When the target throughput value required by the target performance information (TPI) is lower than the maximum throughput value of the maximum performance information (MPI), the ISPP control unit 214 extends the ISPP time $T_{PROG}$ of the memory cell of the storage device 200. Here, the ISPP time $T_{PROG}$ may mean, for example, a time interval from the first program step of the time $t_0$ to the fifth verification step of the time $t_9$.

However, other embodiments are not limited thereto, and the ISPP time $T_{PROG}$ controlled by the ISPP control unit 214 may mean a time interval from the optional first step to the second step. For example, the ISPP time $T_{PROG}$ may mean the time interval from the first program step of the time $t_0$ to the fifth program step of the time $t_8$. As another example, the ISPP time $T_{PROG}$ may also mean a time interval from the second program step of the time $t_2$ to the fourth verification step of the time $t_7$.

In this way, the ISPP control unit 214 may increase the time interval between a specific step and another specific step, thereby extending the ISPP time $T_{PROG}$ of the memory cell of the storage device 200.

Figure 4A:
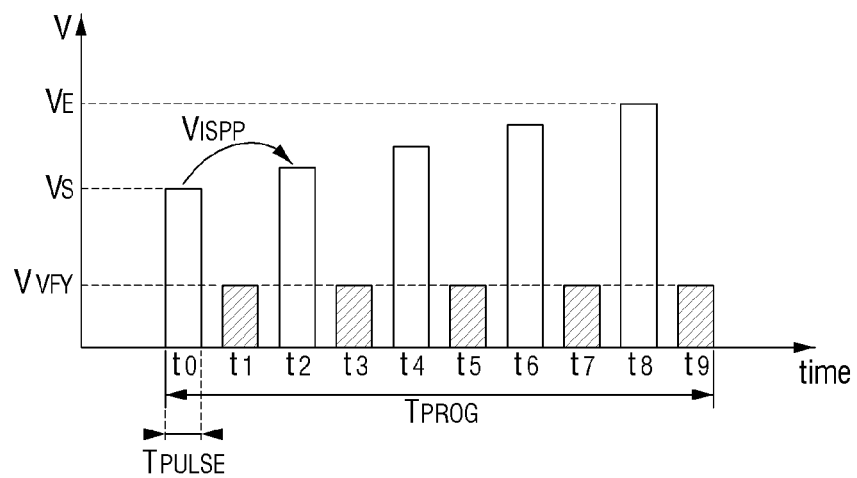
FIG. 4A is a schematic diagram illustrating an ISPP time ($T_{PROG}$) according to an embodiment.
Figure 4B:
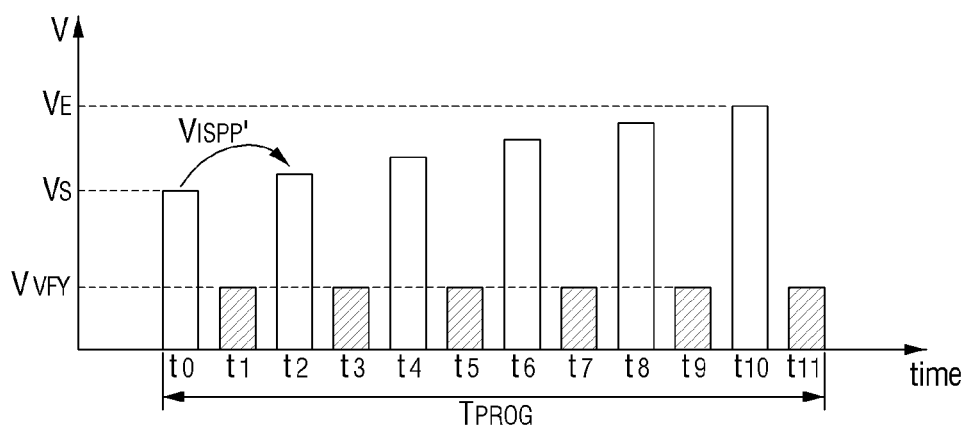
FIG. 4B is a schematic diagram illustrating an ISPP step voltage ($V_{ISPP}'$) according to an embodiment.

FIG. 4B is a schematic diagram illustrating an ISPP step voltage ($V_{ISPP}'$) according to an embodiment. In this embodiment, the ISPP step voltage $V_{ISSP}'$ is smaller than in the corresponding voltage $V_{ISPP}$ of FIG. 4A. With a smaller voltage step, a program time $T_{PROG}$ and/or a number of steps may be increased; however, a reliability of a memory cell being programmed may be improved.

Figure 4C:
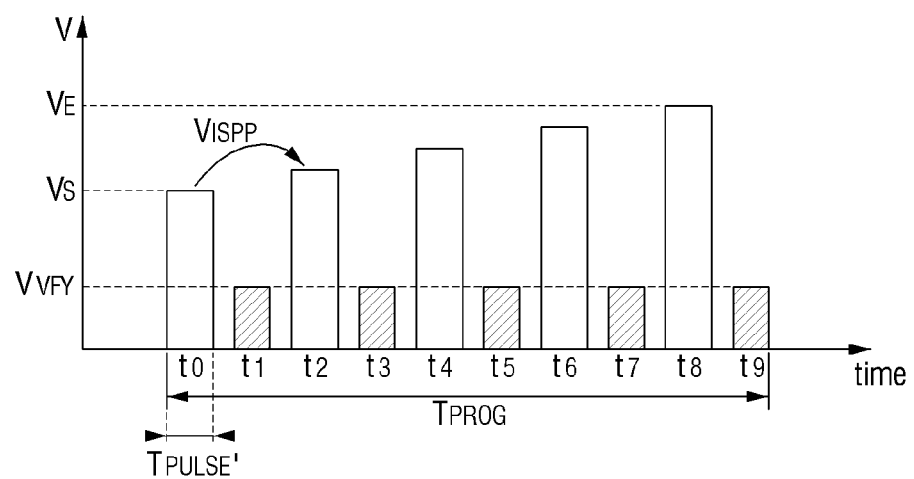
FIG. 4C is a schematic diagram illustrating an ISPP pulse time ($T_{PULSE}$) according to an embodiment.

FIG. 4C is a schematic diagram illustrating an ISPP pulse time ($T_{PULSE}$) according to an embodiment. In this embodiment, the ISPP pulse time $T_{PULSE}'$ is larger than in a corresponding time of FIG. 4A. That is, the length of the program step at time $t_0$, for example, may be longer in FIG. 4C than in FIG. 4A. Accordingly, a latency of programming and/or the program time $T_{PROG}$ may be increased; however, a reliability of a memory cell being programmed may be improved.

Figure 4D:
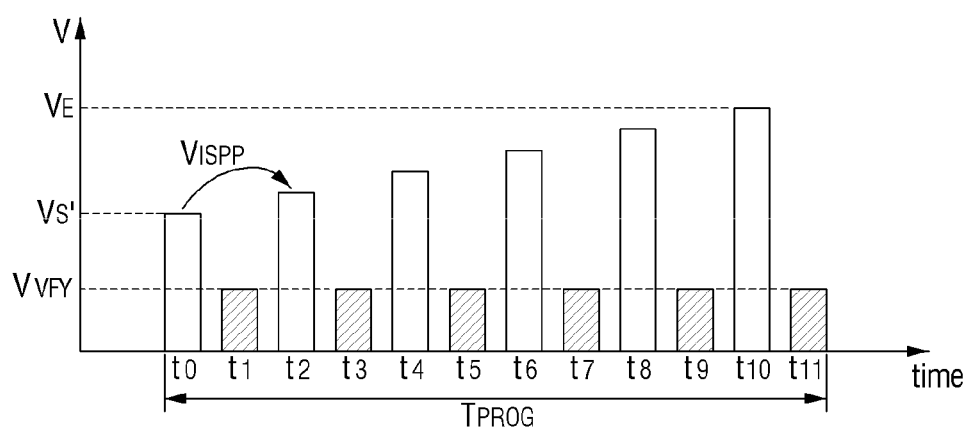
FIG. 4D is a schematic diagram illustrating an ISPP start voltage ($V_S'$) according to an embodiment.

FIG. 4D is a schematic diagram illustrating an ISPP start voltage ($V_S'$) according to an embodiment. In this embodiment the ISPP start voltage $V_S'$ is lower than the start voltage $V_S$ of FIG. 4A. Accordingly, the program time $T_{PROG}$ may be increased; however, a reliability of a memory cell being programmed may be improved.

While various different changed have been described herein to change the operation of one or more programming steps, other embodiments may be different. For example, in some embodiments, both the program step time may be increased and the start voltage may be decreased. In other embodiments, the start voltage may be decreased and the step voltage may be decreased. In other embodiments, other changes may be made to the program operations that may increase latency, decrease throughput, or the like, but also increase reliability, service life, or the like.

Figures 5, 6:
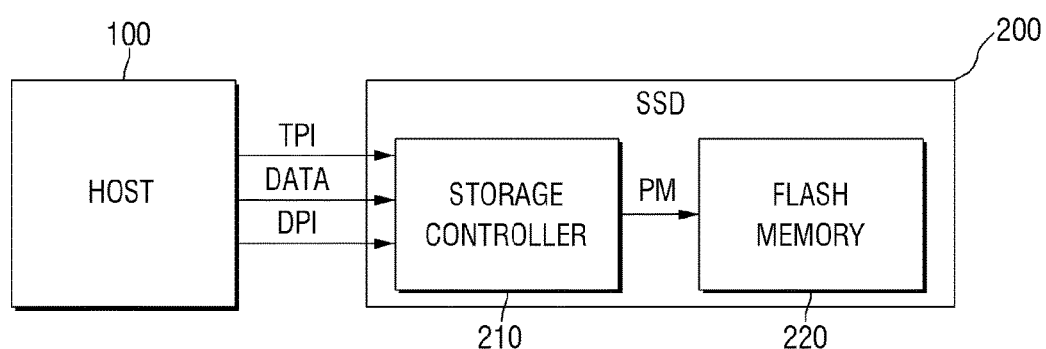
FIG. 5 is a schematic view illustrating an operating mode of the storage device according to an embodiment.
FIG. 6 is a schematic diagram illustrating a storage device according to another embodiment.

FIG. 5 is a schematic diagram illustrating the operating mode of the storage device according to an embodiment. Referring to FIG. 5, the storage device 200 according to an embodiment may operate in a mode of multiple preset operating modes.

Specifically, the performance evaluation unit 212 of the storage controller 210 may be configured to receive the target performance information (TPI) and the internal maximum performance information (MPI), and compare the target performance information (TPI) with the maximum performance information (MPI). As described above, for example, the target performance information (TPI) may be received from an external device, such as the host device 100, and the maximum performance information (MPI) may be set in the storage device 200 in advance.

The ISPP control unit 214 may be configured to compare the target bandwidth required by the target performance information (TPI) with the maximum bandwidth of the maximum performance information (MPI), and select the operating mode of the storage device 200 as one of multiple preset operating modes depending on the comparison result. For example, when the first mode is a service life priority mode and the second mode is a performance priority mode among the operating modes, the program time of the memory cell of the storage device 200 operating in the first mode may be longer than the program time of the memory cell operating in the second mode. In some embodiments, the program time may be an ISPP time $T_{PROG}$ of the memory cell of the storage device 200. In such a case, the ISPP time $T_{PROG}$ of the first mode may be longer than the ISPP time $T_{PROG}$ of the second mode.

Referring to FIG. 5 again, in some embodiments, the operating mode of the storage device 200 may include two or more operating modes. As examples, a first mode through a third mode are illustrated. The first mode is an operating mode in which the performance of the storage device 200 is a higher priority, and the ISPP time $T_{PROG}$ has a value of $T_1$. The third mode is an operating mode in which the service life of the storage device 200 is a higher priority, the performance is a lower priority, and the ISPP time $T_{PROG}$ has a value of $T_3$ greater than $T_1$. The second mode is an eclectic specific mode between the first mode and the second mode, and the ISPP time $T_{PROG}$ has a $T_2$ value greater than $T_1$ and smaller than $T_3$. In some embodiments, the operating modes may be determined at the time of manufacturing of the storage device 200 and may be determined at an initialization phase (e.g., firmware update) of the storage device 200. However, in other embodiments, the operating modes may be determined by configuration of the storage device 200 when it is in a system, such as during installation, maintenance, or the like.

In this way, by comparing the target bandwidth of the host 100 with the maximum bandwidth of the storage device 200 and by selecting the preset operating mode that restrictively uses the bandwidth of the storage device 200, it is possible to address both of the extension of service life and the performance aspects of the storage device 200.

FIG. 6 is a schematic diagram illustrating a storage device according to another embodiment. Referring to FIG. 6, a storage system 2 according to another embodiment includes a host device 100 (or an external device) and a storage device 200. This embodiment is different from the embodiment illustrated in FIG. 1 in that the host device 100 is configured to provide the storage controller 210 with data pattern information (DPI) as well as the target performance information (TPI). Here, the data pattern information refers to information about the pattern of the data recorded on the storage device 200 from the host device 100. For example, the data pattern information may include ratio information between a sequential access and a random access. The storage controller 210 may be configured to calculate garbage collecting overhead, using the data pattern information received from an external device, such as the host device 100, and may adjust the rate of the programming PM of the flash memory 220, using the target performance information (TPI) in consideration of the garbage collecting overhead.

For example, the garbage collecting overhead of the data accessed through random accesses may be larger than the garbage collecting overhead of the data accessed through sequential accesses. The effect of the performance degradation caused by the garbage collecting overhead may affect the program PM rate adjustment for extending the service life, while limiting the performance of the storage device 200. This will be described below in more detail in connection with FIG. 7.

Figures 7, 8:
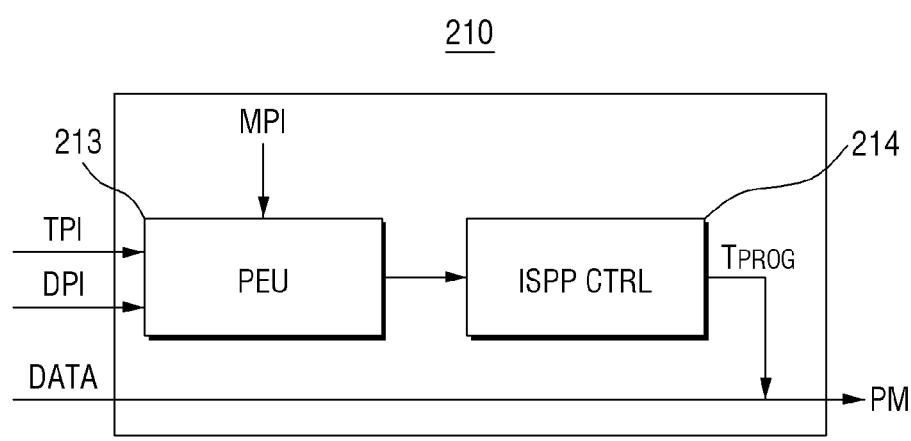
FIG. 7 is a schematic diagram illustrating a storage controller according to another embodiment.
FIG. 8 is a schematic diagram illustrating an operating mode of the storage device according to another embodiment.

FIG. 7 is a schematic diagram illustrating a storage controller according to another embodiment. Referring to FIG. 7, a storage controller 210 according to another embodiment includes a performance evaluation unit 213 and an ISPP control unit 214. The performance evaluation unit 213 and the ISPP control unit 214 may be similar to the performance evaluation unit 212 and the ISPP control unit 214 described above.

However, the performance evaluation unit 213 is configured to receive the target performance information (TPI), the data pattern information (DPI), and the internal maximum performance information (MPI), and compute the garbage collecting overhead using the data pattern information (DPI). Thereafter, the performance evaluation unit 213 may be configured to compare the target performance information (TPI) with the maximum performance information (MPI) in consideration of garbage collecting overhead. Here, the target performance information (TPI) and the data pattern information (DPI) are received from the external device, such as the host device 100, and the maximum performance information (MPI) may be set in the storage device 200 in advance.

The ISPP control unit 214 is configured to extend the ISPP time $T_{PROG}$ of the memory cell of the storage device 200, when the target throughput value required by the target performance information (TPI) is lower than the maximum throughput value of the maximum performance information (DPI) in consideration of the garbage collecting overhead computed using the data pattern information (MPI).

For example, if the ISPP time is a first time, the storage device 200 may be configured to operate at a higher or maximum performance, and if the ISPP time is a second time that is twice the first time, the performance of the storage device 200 may be limited and the service life may be extended. When recognizing information indicating that data is accessed more through sequential accesses is higher from the data pattern information (DPI), the second time to extend service life in consideration of the garbage collecting overhead may be computed as, for example, 0.75 * the second time in consideration of the performance degradation caused by the garbage collecting overhead. Alternately, when recognizing information indicating that the data is accessed more through random accesses from the data pattern information (DPI), the second time to extend service life in consideration of the garbage collecting overhead may be computed, for example, as 0.45 * the second time in consideration of the performance degradation caused by the garbage collecting overhead. That is, as the performance degradation due to the garbage collecting overhead is large, the rate of increase the ISPP time $T_{PROG}$ may be reduced.

In this way, when the target throughput value of the host 100 is lower than the maximum throughput value of the storage device 200, when restrictively using the bandwidth of the storage device 200, it is possible to extend the service life of the storage device 200. In particular, programming of the memory cell at maximum rate shortens the service life of the memory cell, which eventually may affect the service life of the storage device 200.

Moreover, by analyzing the data pattern, and by limiting the bandwidth of the storage device 200 in consideration of the garbage collecting overhead, it is possible to more precisely control the storage device 200.

FIG. 8 is a schematic diagram illustrating an operating mode of a storage device according to another embodiment. Referring to FIGS. 2 and 8, the storage device 200 according to an embodiment may operate in one of multiple preset operating modes.

Specifically, a performance evaluation unit 212 of a storage controller 210 may be configured to receive the target performance information (TPI) and the internal maximum performance information (MPI), and compare the target performance information (TPI) with the maximum performance information (MPI). Here, the target performance information (TPI) is received from an external device, such as the host device 100, and the maximum performance information (MPI) is set in the storage device 200 in advance.

The ISPP control unit 214 may be configured to compare the target bandwidth required by the target performance information (TPI) with the maximum bandwidth of the maximum performance information (MPI), and may select the operating mode of the storage device 200 as one of multiple preset operating modes depending on the comparison result. For example, assuming that the flash memory 220 is made of a first level memory cell, when the first mode among multiple operating modes is a service life priority mode and the second mode is a performance priority mode, the program time of the memory cell of the storage device 200 operating in the first mode may be longer than the program time of the memory cell operating in the second mode.

To this end, the first level memory cell may be used at the bandwidth of the second level memory cell of a type different from the first level memory cells. Here, the number of storage bits per unit cell of the first level memory cell (e.g., a triple level cell (TLC)) may be greater than the number of storage bits per unit cell of the second level memory cell (e.g., a multiple level cell (MLC)). In some embodiments, the use of first level memory cell at the bandwidth of the second level memory cell may be achieved by using only a part of the number of storage bits per unit cell of the first level memory cell.

In some embodiments, when the first level memory cell is the multiple level cell (MLC), the second level memory cell may be a single level cell (SLC). In some other embodiments, when the first level memory cell is the triple level cell (TLC), the second level memory cell may be the single level cell (SLC) or the multiple level cell (MLC). In some other embodiments, when the first level memory cell is a quad level cell (QLC), the second level memory cell may be the single level cell (SLC), the multiple level cell (MLC) or the triple level cell (TLC).

In some embodiments, a memory cell of the flash memory 220 is a triple level cell (TLC), and the operating mode of the storage device 200 may include two or more operating modes, such as a first mode through a third mode of this example. The first mode is an operating mode in which the performance of the storage device 200 is a higher priority, and the memory cell operating mode is a single level cell (SLC) mode. Next, the third mode is an operating mode in which the service life of the storage device 200 is the higher priority, the performance is a lower priority, and the memory cell operating mode is a triple level cell (TLC) mode. The second mode is an eclectic mode between the first mode and the second mode, and the memory cell operating mode is a multiple level cell (MLC). In some embodiments, the operating modes may be determined at the time of manufacturing of the storage device 200, and may be determined at the initialization stage (e.g., firmware update) of the storage device 200. However, in other embodiments, the operating modes may be determined by configuration of the storage device 200 when it is in a system, such as during installation, maintenance, or the like.

In this way, by comparing the target bandwidth of the host 100 with the maximum bandwidth of the storage device 200 to select the preset operating mode that restrictively uses the bandwidth of the storage device 200, it is possible to address both the extension of service life and the performance aspects of the storage device 200.

Figure 9:
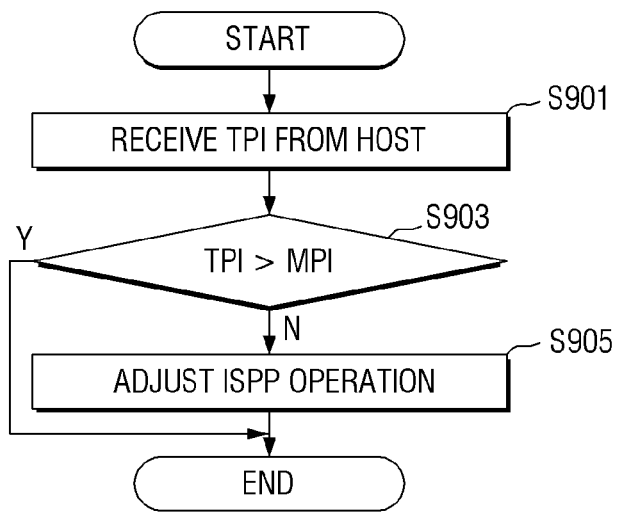
FIG. 9 is a flow chart illustrating a method for controlling of the storage device according to an embodiment.

FIG. 9 is a flow chart illustrating a method for controlling of a storage device according to an embodiment. Referring to FIG. 9, a method for controlling of the storage device according to an embodiment includes receiving the target performance information (TPI) from the host device 100 (S901), and comparing the target performance information (TPI) with the internal maximum performance information (MPI) (S903). If the target throughput value of the target performance information (TPI) is equal to or less than the throughput value of the maximum performance information (MPI), the ISPP operation is adjusted (S905). For example, the ISPP time may be increased, the ISPP step voltage may be reduced, the pulse program time may be increased, the start voltage may be reduced, or the like. Any aspect of the operation of the ISPP may be adjusted to increase reliability, service life, or the like may be changed in attempt to increase the reliability, service life, or the like.

Figure 10:
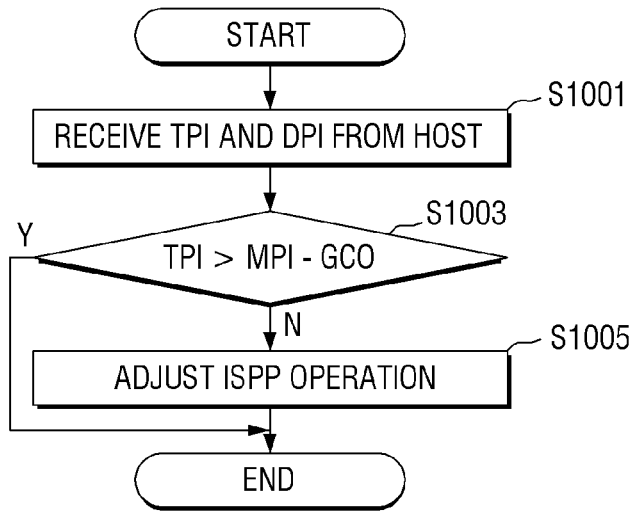
FIG. 10 is a flow chart illustrating a method for controlling of a storage device according to another embodiment.

FIG. 10 is a flow chart illustrating a method for controlling of a storage device according to another embodiment. Referring to FIG. 10, the method for controlling of the storage device according to an embodiment includes receiving the target performance information (TPI) and the data pattern information (DPI) from the host device 100 (S1001), and comparing the target performance information (TPI) with the internal maximum performance information (MPI) in consideration of the garbage collecting overhead (GCO) computed using the data pattern information (DPI) (S1003). If the target throughput value of the target performance information (TPI) is equal to or less than the throughput value of the maximum performance information (MPI) in consideration of the garbage collecting overhead (GCO), the ISPP time is extended (S1005). For example, the ISPP time may be increased, the ISPP step voltage may be reduced, the pulse program time may be increased, the start voltage may be reduced, or the like. Any aspect of the operation of the ISPP may be adjusted to increase reliability, service life, or the like may be changed in attempt to increase the reliability, service life, or the like.

According to the various embodiments, in a case where the target throughput value of the host 100 is lower than the maximum throughput value of the storage device 200, when restrictively using the bandwidth of the storage device 200, it is possible to extend the service life of the storage device 200. For example, programming of the memory cells at maximum rate shortens the service life of the memory cell, thereby eventually affecting the service life of the storage device 200. In particular, in a data center that uses a large-scale storage device, the reliability of data may be more important than the data input and output rates. Accordingly, the service life of the storage device may be extended by restrictively using a storage device capable of achieving high data input and output rates. Moreover, by analyzing the data pattern to limit the bandwidth of the storage device 200 in consideration of the garbage collecting overhead, is possible to more delicately control the storage device 200. That is, the garbage collecting overhead of the data accessed through random accesses may be greater than the garbage collecting overhead of the data accessed through the sequential accesses. The performance degradation caused by garbage collecting overhead may be considered in a program (PM) rate adjustment for extending the service life by limiting the performance of the storage device 200.

Some embodiments include a storage device that extends a service life of the SSD by restrictively using the bandwidth of the SSD.

Some embodiments include a method for controlling of a storage device that extends a service life of the SSD by restrictively using the bandwidth of the SSD.

Some embodiments include a method for controlling of a storage device including receiving target performance information (TPI) from an external device, comparing the target performance information with maximum performance information (MPI) inside a SSD, and extending an incremental step pulse program time (ISPP) of a memory cell of the SSD, when a target throughput value required by the target performance information is lower than a maximum throughput value of the maximum performance information.

Some embodiments include a method for controlling of a storage device including receiving target performance information (TPI) from an external device, comparing a target bandwidth of the target performance information with a maximum bandwidth of the maximum performance information (MPI) inside a SSD, and selecting an operating mode of the SSD from a preset first mode or a preset second mode depending on the comparison result, wherein a program time of a memory cell of the SSD operating in the first mode is longer than a program time of the memory cell operating in the second mode.

Some embodiments include a storage device including a performance evaluation unit that receives target performance information (TPI) from an external device, and compares the target performance information with an internal maximum performance information (MPI), a storage controller comprising an ISPP control unit that extends an incremental step pulse program (ISPP) time of the memory cell of the SSD, when a target throughput value required by the target performance information is lower than a maximum throughput value of the maximum performance information, and a flash memory that is controlled by the storage controller and programs the memory cells for the extended ISPP time.

Figure 11:
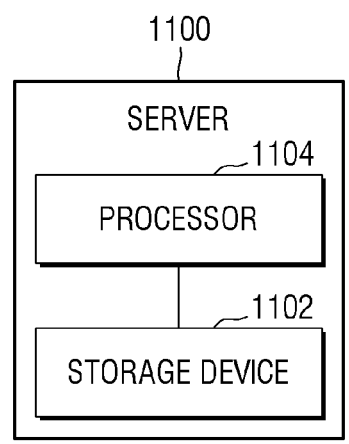
FIG. 11 is a schematic view of a server according to an embodiment.

FIG. 11 is a schematic view of a server according to an embodiment. In this embodiment, the server 1100 may include a stand-alone server, a rack-mounted server, a blade server, or the like. The server 1100 includes a storage device 1102 and a processor 1104. The processor 1104 is coupled to the storage device 1102. Although only one storage device 1102 is illustrated, any number of storage devices 1102 may be present. The storage device 1102 may be any of the above described storage devices. Accordingly, a service life of the server 1100 may be improved.

Figure 12:
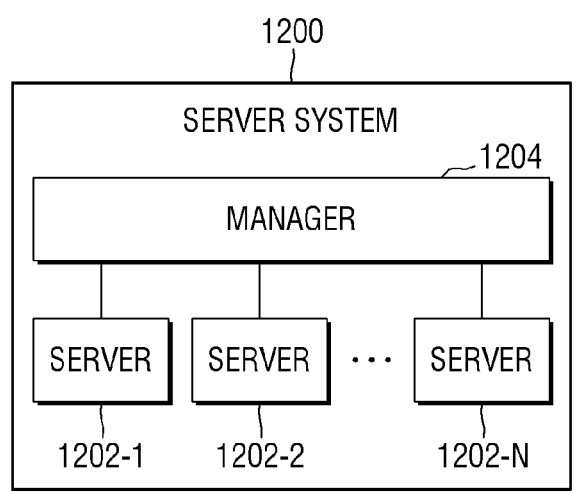
FIG. 12 is a schematic view of a server system according to an embodiment.

FIG. 12 is a schematic view of a server system according to an embodiment. In this embodiment, the server system 1200 includes multiple servers 1202-1 to 1202-N. The servers 1202 are each coupled to a manager 1204. One or more of the servers 1202 may be similar to the server 1100 described above.

The manager 1204 is configured to manage the servers 1202 and other components of the server system 1200. In an embodiment, the manager 1204 may be configured to monitor the performance of the servers 1202. For example, as each of the servers 1202 may include a storage device as described above. The manager 1204 may be configured to manage the target performance information for storage devices of the servers 1202.

Figure 13:
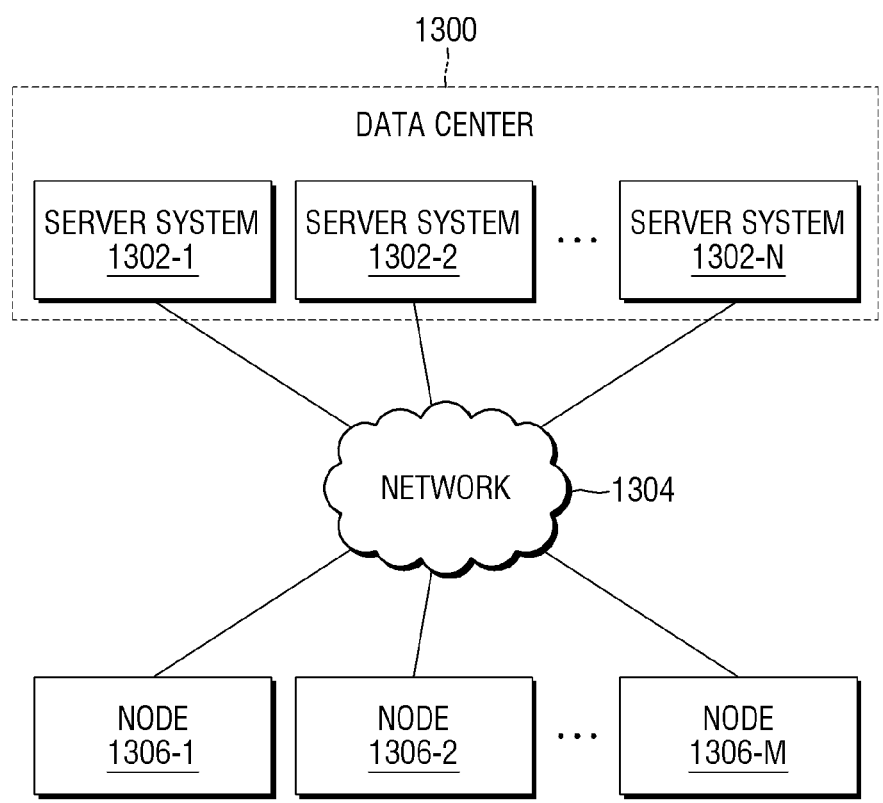
FIG. 13 is a schematic view of a data center according to an embodiment.

FIG. 13 is a schematic view of a data center according to an embodiment. In this embodiment, the data center 1300 includes multiple servers systems 1302-1 to 1302-N. The server systems 1302 may be similar to the server system 1200 described above in FIG. 12. The server systems 1302 are coupled to a network 1304, such as the Internet. Accordingly, the server systems 1302 may communicate through the network 1304 with various nodes 1306-1 to 1306-M. For example, the nodes 1306 may be client computers, other servers, remote data centers, storage systems, or the like.

While embodiments have been particularly illustrated and described with reference to particular embodiments, it will be understood by those of ordinary skill in the art that various changes in form and detail may be made therein without departing from the spirit and scope as defined by the following claims. The particular embodiments should be considered in a descriptive sense only and not for purposes of limitation.

What is claimed is:

1. A method, comprising:
   receiving a target performance information by a storage device;
   comparing the target performance information with a maximum performance information by the storage device to determine whether the target performance information is lower than the maximum performance information;
   adjusting an incremental step pulse program (ISPP) operation in response to the comparing of the target performance information with the maximum performance information; and
   performing the ISPP operation on a memory cell of the storage device.

2. The method of claim 1,
   wherein the ISPP operation includes a first step and a second step, and
   wherein the adjusting of the ISPP operation comprises increasing a time interval between the first step and the second step.

3. The method of claim 2,
   wherein each of the first step and the second step comprises a program step or a verification step of the ISPP operation.

4. The method of claim 2,
wherein the first step comprises an initial program step and the second step comprises a final verification step.

5. The method of claim 1, further comprising:
receiving, by the storage device, a data pattern information about data stored by the storage device; and
computing a garbage collecting overhead using the data pattern information,
wherein the adjusting of the ISPP operation comprises adjusting the ISPP operation based on the garbage collecting overhead.

6. The method of claim 1, further comprising:
operating the memory cell as a lower capacity memory cell if a target throughput value of the target performance information is higher than a maximum throughput value of the maximum performance information.

7. The method of claim 6,
wherein the operating of the memory cell as the lower capacity memory cell comprises:
using only a part of a number of storage bits per unit cell of the memory cell.

8. The method of claim 1,
wherein the adjusting of the ISPP operation comprises:
increasing a program pulse time of the ISPP operation if a target throughput value of the target performance information is lower than a maximum throughput value of the maximum performance information.

9. The method of claim 1,
wherein the adjusting of the ISPP operation comprises:
decreasing a step voltage for the ISPP operation if a target throughput value of the target performance information is lower than a maximum throughput value of the maximum performance information.

10. The method of claim 1,
wherein the adjusting of the ISPP operation comprises:
decreasing an initial program voltage for the ISPP operation if a target throughput value of the target performance information is lower than a maximum throughput value of the maximum performance information.

11. A method, comprising:
receiving a target performance information by a storage device;
comparing, by the storage device, a target bandwidth of the target performance information with a maximum bandwidth of a maximum performance information to determine whether the target bandwidth is greater than the maximum bandwidth; and
changing a programming mode of a memory cell of the storage device based on a comparing of the target bandwidth and the maximum bandwidth.

12. The method of claim 11,
wherein the changing of the programming mode comprises:
changing to a service life priority mode if the target bandwidth is less than the maximum bandwidth; and
changing to a performance priority mode if the target bandwidth is greater than the maximum bandwidth.

13. The method of claim 11,
wherein the changing of the programming mode comprises:
changing a program time of an incremental step pulse program (ISPP) operation.

14. The method of claim 13,
wherein a time interval between an initial program step and a final program step of the ISPP operation in a first mode is longer than a time interval between an initial program step and a final program step of the ISPP operation in a second mode.

15. The method of claim 11,
wherein the changing of the programming mode comprises:
changing a number of bits stored in the memory cell.

16. The method of claim 15,
wherein the changing of the number of bits stored in the memory cell comprises:
operating the memory cell at a storage capacity less than a maximum storage capacity of the memory cell if the target bandwidth is greater than the maximum bandwidth.

17. A method, comprising:
receiving a target performance information by a storage device;
comparing the target performance information with a maximum performance information by the storage device to determine whether the target performance information is lower than the maximum performance information; and
adjusting an incremental step pulse program (ISPP) operation performed on a memory cell of the storage device to increase service life of the storage device if the comparing of the target performance information with the maximum performance information indicates that a performance capability associated with the maximum performance information of the storage device is greater than a performance capability associated with the target performance information.

18. The method of claim 17,
wherein the performance capability associated with the target performance information includes at least one of a bandwidth and a throughput.

19. The method of claim 17,
wherein the adjusting of the ISPP operation comprises:
adjusting at least one of a program time, a program voltage, a program voltage step, and a program pulse time.

* * * * *